(12) United States Patent
Ukai et al.

(10) Patent No.: US 9,406,861 B2
(45) Date of Patent: Aug. 2, 2016

(54) PIEZOELECTRIC ELEMENT AND PIEZOELECTRIC DEVICE USING THE SAME

(71) Applicant: Murata Manufacturing Co., Ltd., Nagaokakyo-shi, Kyoto-fu (JP)

(72) Inventors: Hiroyuki Ukai, Nagaokakyo (JP); Shungo Kanai, Nagaokakyo (JP); Hiroyuki Hayashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 424 days.

(21) Appl. No.: 13/969,759

(22) Filed: Aug. 19, 2013

(65) Prior Publication Data

US 2013/0334933 A1    Dec. 19, 2013

Related U.S. Application Data

(63) Continuation of application No. PCT/JP2012/053147, filed on Feb. 10, 2012.

(30) Foreign Application Priority Data

Mar. 1, 2011 (JP) ................................. 2011-043847

(51) Int. Cl.
*H01L 41/083* (2006.01)
*H01L 41/047* (2006.01)
(Continued)

(52) U.S. Cl.
CPC .......... *H01L 41/0472* (2013.01); *F04B 43/046* (2013.01); *H01L 41/0471* (2013.01);
(Continued)

(58) Field of Classification Search
CPC .............. H01L 41/083; H01L 41/0474; H01L 41/0472; F04B 43/046
USPC ................................................... 310/328, 366
See application file for complete search history.

(56) References Cited

U.S. PATENT DOCUMENTS 4,257,686 A * 3/1981 Albertinetti ........... H01L 41/083
359/395
6,433,654 B1 * 8/2002 Kanai ................. H03H 9/0561
333/187

(Continued)

FOREIGN PATENT DOCUMENTS

DE   WO 2005067070 A1 * 7/2005 .......... H01L 41/0474
JP   03-171784 A   7/1991
(Continued)

OTHER PUBLICATIONS

Official Communication issued in International Patent Application No. PCT/JP2012/053147, mailed on Mar. 19, 2012.

*Primary Examiner* — J. San Martin
(74) *Attorney, Agent, or Firm* — Keating & Bennett, LLP

(57) ABSTRACT

A piezoelectric element, which is capable of being driven with a relatively low voltage and obtaining a large displacement amount at a central portion thereof and is not degraded in characteristics over time and is easily mountable on or in a piezoelectric device, includes a piezoelectric body including a plurality of laminated piezoelectric layers, ground electrodes, central electrodes, and peripheral electrodes. A surface of the piezoelectric body includes first to fifth terminals. The extraction of the ground terminals, the central electrodes, and the peripheral electrodes to the first to fifth terminals is configured to connect one terminal of an alternating-current power supply to the third terminal and connect the other terminal of the alternating-current power supply to the first terminal and the second terminal.

20 Claims, 13 Drawing Sheets

(51) Int. Cl.
  *F04B 43/04* (2006.01)
  *H01L 41/09* (2006.01)

(52) U.S. Cl.
  CPC ........ *H01L41/0474* (2013.01); *H01L 41/0475* (2013.01); *H01L 41/083* (2013.01); *H01L 41/0973* (2013.01)

(56) References Cited

U.S. PATENT DOCUMENTS

| | | | | |
|---|---|---|---|---|
| 7,352,116 B2* | 4/2008 | Nakao | ............ | H01G 4/0085 310/328 |
| 7,545,085 B2* | 6/2009 | Adachi | ............ | H01L 41/083 310/365 |
| 8,299,684 B2* | 10/2012 | Petrenko | ............ | H01L 41/0986 310/323.02 |
| 2002/0149301 A1* | 10/2002 | Maruyama | ......... | H01L 41/0472 310/366 |
| 2003/0201695 A1* | 10/2003 | Funakubo | ............ | H01L 41/083 310/323.01 |
| 2005/0275318 A1* | 12/2005 | Maruyama | ......... | H01L 41/0474 310/366 |
| 2006/0061241 A1* | 3/2006 | Sasaki | ............ | H01L 41/0474 310/366 |
| 2006/0175930 A1* | 8/2006 | Ganor | ............ | H02N 2/0075 310/317 |
| 2007/0052329 A1* | 3/2007 | Koc | ............ | H02N 2/026 310/365 |
| 2009/0142209 A1* | 6/2009 | Hirata | ............ | F04B 43/046 417/413.2 |
| 2009/0214362 A1* | 8/2009 | Kanai | ............ | F04B 43/046 417/413.2 |
| 2010/0072858 A1* | 3/2010 | Ando | ............ | H01L 41/0906 310/323.16 |
| 2011/0175491 A1* | 7/2011 | Miyano | ............ | H01L 41/0471 310/323.16 |
| 2013/0241361 A1* | 9/2013 | Lee | ............ | H01G 4/30 310/366 |
| 2014/0346924 A1* | 11/2014 | Son | ............ | B06B 1/0603 310/317 |

FOREIGN PATENT DOCUMENTS

| | | | |
|---|---|---|---|
| JP | 2006157172 A | * | 6/2006 |
| JP | 2009063002 A | * | 3/2009 |
| WO | 2008/007634 A1 | | 1/2008 |
| WO | 2009/072434 A1 | | 6/2009 |

* cited by examiner

100

← → EXPANSION
→ ← CONTRACTION

300

400

PIEZOELECTRIC ELEMENT AND PIEZOELECTRIC DEVICE USING THE SAME

BACKGROUND OF THE INVENTION

1. Field of the Invention

The present invention relates to a piezoelectric element, and more specifically, to a piezoelectric element which is easy to mount on or in a piezoelectric device, such as a piezoelectric pump. The present invention further relates to a piezoelectric device including the piezoelectric element.

2. Description of the Related Art

A piezoelectric element has recently been used as a drive source of a small-sized, high-precision pump, blower, fan, or other suitable device. Further, the piezoelectric element for this purpose is required to be capable of being driven with a relatively low voltage and obtaining a large displacement amount at a central portion of the piezoelectric element, and not to be degraded in characteristics over time.

These demands are satisfied by, for example, a piezoelectric element for a drive source of a piezoelectric pump disclosed in WO 2008/007634.

FIGS. 10 and 11 illustrate a piezoelectric element 400 disclosed in WO 2008/007634. FIG. 10 is a perspective view, and FIG. 11 is an exploded perspective view.

The piezoelectric element 400 includes a piezoelectric body 101 including a plurality of laminated piezoelectric layers 101a to 101h. A first terminal 111, a second terminal 112, and a third terminal 113 are arranged in a line on surfaces of the piezoelectric body 101.

A rectangular ground electrode 121 is provided on a surface of the piezoelectric layer 101a defining the uppermost layer. The ground electrode 121 is extracted to the second terminal 112.

A circular central electrode 124 is provided in a central portion of a surface of the next piezoelectric layer 101b, and a ring-shaped peripheral electrode 125 is provided therearound. The central electrode 124 is extracted to the third terminal 113, and the peripheral electrode 125 is extracted to the first terminal 111.

A rectangular ground electrode 121 is provided on a surface of the next piezoelectric layer 101c. The ground electrode 121 is extracted to the second terminal 112.

A circular central electrode 124 is provided in a central portion of a surface of the next piezoelectric layer 101d, and a ring-shaped peripheral electrode 125 is provided therearound. The central electrode 124 is extracted to the third terminal 113, and the peripheral electrode 125 is extracted to the first terminal 111.

A rectangular ground electrode 121 is provided on a surface of the next piezoelectric layer 101e. The ground electrode 121 is extracted to the second terminal 112.

A circular central electrode 124 is provided in a central portion of a surface of the next piezoelectric layer 101f, and a ring-shaped peripheral electrode 125 is provided therearound. The central electrode 124 is extracted to the first terminal 111, and the peripheral electrode 125 is extracted to the third terminal 113.

A rectangular ground electrode 121 is provided on a surface of the next piezoelectric layer 101g. The ground electrode 121 is extracted to the second terminal 112.

A circular central electrode 124 is provided in a central portion of a surface of the next piezoelectric layer 101h, and a ring-shaped peripheral electrode 125 is provided therearound. The central electrode 124 is extracted to the first terminal 111, and the peripheral electrode 125 is extracted to the third terminal 113. Further, the rear surface of the piezoelectric layer 101h is provided with a rectangular ground electrode 121. Furthermore, the ground electrode 121 is extracted to the second terminal 112.

The existing piezoelectric element 400 includes the ground electrodes 121 exposed on both upper and lower surfaces thereof. However, the piezoelectric element 400 may be configured such that piezoelectric layers which do not include an electrode are laminated on both the upper and lower surfaces so as not to expose the ground electrodes 121.

The piezoelectric body 101 having the above-described structure is formed by a method of, for example, laminating, compressing, and firing piezoelectric green sheets for forming the piezoelectric layers 101a to 101h, on which the necessary electrodes (the ground electrodes 121, the central electrodes 124, and the peripheral electrodes 125) are formed by conductive paste or the like. Further, the first terminal 111, the second terminal 112, and the third terminal 113 are formed by a method of, for example, baking conductive paste onto surfaces of the fired piezoelectric body 101.

As illustrated in FIGS. 12A and 12B, for example, the piezoelectric element 400 is polarized by a direct-current voltage applied to the first terminal 111, the second terminal 112, and the third terminal 113. FIGS. 12A and 12B are explanatory diagrams illustrating a polarization process of the piezoelectric element 400. FIG. 12B illustrates a portion of FIG. 12A indicated by a dash-dotted line X-X. In FIG. 12B, the scale in the height direction is enlarged as compared to that in the width direction to clarify polarization directions.

As illustrated in FIG. 12A, the first terminal 111, the second terminal 112, and the third terminal 113 are applied with a negative voltage, a ground voltage, and a positive voltage, respectively. As a result, as illustrated in FIG. 12B, each of the piezoelectric layers 101a to 101h of the piezoelectric element 400 is polarized in the directions indicated by arrows in the drawing. As understood from FIG. 12B, in each of the piezoelectric layers 101a to 101h, the polarization direction is opposite between a central portion and a peripheral portion. Further, due to the difference in extraction of the central electrodes 124 and the peripheral electrodes 125 to the first terminal 111 and the third terminal 113, the repeating order of polarization is different between the piezoelectric layers 101a to 101d and the piezoelectric layers 101e to 101h.

The piezoelectric element 400 having such a structure and subjected to polarization is used as, for example, a drive source of a piezoelectric device, such as a piezoelectric pump. FIGS. 13A and 13B illustrate a piezoelectric pump 500 including the piezoelectric element 400 as a drive source thereof. FIG. 13A is a perspective view, and FIG. 13B is a cross-sectional view illustrating a portion of FIG. 13A indicated by a dash-dotted line Y-Y.

The piezoelectric pump 500 includes a pump body 131. The pump body 131 includes a hollow pump chamber 131a, an opening 131b that opens an upper portion of the pump chamber 131a, and two holes 131c and 131d that communicate with the pump chamber 131a.

The opening 131b is closed by a diaphragm 132, and the piezoelectric element 400 is bonded and fixed to the diaphragm 132.

Further, an inflow check valve 133 is attached to the hole 131c, and an outflow check valve 134 is attached to the hole 131d. The inflow check valve 133 functions to allow fluid to flow into the pump chamber 131a from the outside but prevent fluid from flowing out in the opposite direction. The outflow check valve 134 functions to allow fluid to flow to the outside from the pump chamber 131a but prevent fluid from flowing in the opposite direction.

Further, three metal terminal members 141, 142, and 143 are fixed on the upper surface of the pump body 131. Further, the metal terminal members 141, 142, and 143 are connected to the first terminal 111, the second terminal 112, and the third terminal 113 of the piezoelectric element 400, respectively, by a bonding material, such as conductive paste or solder. The illustration of the boding material is omitted in FIG. 13A.

FIGS. 14A to 14C illustrate a drive state of the piezoelectric pump 500. FIGS. 14A to 14C are explanatory diagrams. FIGS. 14B and 14C illustrate a portion of the piezoelectric element 400 in FIG. 14A indicated by a dash-dotted line Z-Z. In FIG. 14B, the scale in the height direction is enlarged as compared to that in the width direction to clarify the expansion and contraction of the piezoelectric layers 101a to 101h defining the piezoelectric element 400.

As illustrated in FIGS. 14A and 14B, to drive the piezoelectric pump 500, the piezoelectric element 400 includes an alternating-current power supply serving as a drive power supply and including one terminal connected to the second terminal 112 via the metal terminal member 142 and the other terminal connected to the first terminal 111 and the third terminal 113 via the metal terminal member 141 and the metal terminal member 143, respectively. The alternating-current power supply is not limited to the one that generates sine waves, and may be the one that generates, for example, rectangular waves.

The piezoelectric layers 101a to 101h forming the piezoelectric body 101 of the piezoelectric element 400 are polarized, as illustrated in FIG. 12B. When applied with an alternating-current voltage, therefore, the piezoelectric layers 101a to 101h partially expand or contract at some point of time, as indicated by arrows in FIG. 14B, for example. At this point of time, for example, a central portion of the piezoelectric layers 101a to 101d contracts, and a peripheral portion located therearound expands. Meanwhile, a central portion of the piezoelectric layers 101e to 101h expands, and a peripheral portion located therearound contracts. As a result, the piezoelectric element 400 includes a central portion downwardly bent and displaced and a peripheral portion upwardly bent and displaced, as indicated by hatched arrows in FIG. 14C.

Then, if the polarity of the alternating-current power supply changes, the piezoelectric element 400 exhibits an opposite behavior to that illustrated in FIG. 14B and FIG. 14C. That is, the central portion of the piezoelectric layers 101a to 101d expands, and the peripheral portion located therearound contracts. Further, the central portion of the piezoelectric layers 101e to 101h contracts, and the peripheral portion located therearound expands. As a result, the piezoelectric element 400 includes the central portion upwardly bent and displaced and the peripheral portion downwardly bent and displaced.

Applied with the alternating-current voltage, the piezoelectric element 400 repeats these behaviors. Thereby, in the piezoelectric pump 500 illustrated in FIGS. 13A and 13B, fluid flows into the pump chamber 131a through the hole 131c, and the fluid flows into the pump chamber 131a flows to the outside through the hole 131d.

In the existing piezoelectric element 400 having the above-described configuration, the piezoelectric body 101 includes multiple layers of the piezoelectric layers 101a to 101h, and each of the piezoelectric layers 101a to 101h is polarized in the opposite directions between the central portion and the peripheral portion. It is therefore possible to drive the piezoelectric element 400 with a relatively low voltage, and to obtain a large displacement amount at the central portion of the piezoelectric element 400. Accordingly, a piezoelectric device (such as the piezoelectric pump 500) including the piezoelectric element 400 as a drive source thereof efficiently functions with low power consumption.

Further, the existing piezoelectric element 400 has functions of preventing, when in use, electromigration between the central electrode 124 and the peripheral electrode 125 provided on the same layer, and not being degraded in characteristic over time. That is, there was an issue that, if a central electrode and a peripheral electrode provided on the same layer are different in potential when is use, electromigration may occur between the central electrode and the peripheral electrode after a certain period of usage, and cause a short circuit therebetween and the degradation of characteristics or the breakage of a piezoelectric element. This issue was serious particularly when Ag was used as a main component of the central electrode and the peripheral electrode.

Meanwhile, when the piezoelectric element 400 is in use, the alternating-current power supply has one terminal connected to the second terminal 112 and the other terminal connected to the first terminal 111 and the third terminal 113, as illustrated in FIGS. 14A and 14B, with the first terminal 111 and the third terminal 113 constantly maintained at the same potential. As a result, all of the central electrodes 124 and the peripheral electrodes 125 in the piezoelectric element 400 are constantly maintained at the same potential. Thus, electromigration does not occur between the central electrode 124 and the peripheral electrode 125 provided on the same layer, and no short circuit occurs therebetween. The piezoelectric element 400 does not suffer the degradation of characteristics over time and breakage due to electromigration.

As described above, the existing piezoelectric element 400 disclosed in WO 2008/007634 has excellent features of being capable of being driven with a relatively low voltage and obtaining a large displacement amount at the central portion of the piezoelectric element, and not being degraded in characteristics over time.

However, the piezoelectric element 400 has an issue that, when used as a drive source of a piezoelectric device, such as a piezoelectric pump, all of the first terminal 111, the second terminal 112, and the third terminal 113 need to be connected to the terminals of the alternating-current power supply (drive power supply), and thus, that the degree of design freedom of the piezoelectric device is restricted and the manufacturing of the piezoelectric device is complicated.

That is, in the piezoelectric element 400, the first terminal 111 and the third terminal 113 are constantly applied with a voltage of the same potential from the alternating-current power supply, as illustrated in FIGS. 14A and 14B. However, the second terminal 112 is disposed between the first terminal 111 and the third terminal 113. Therefore, the first terminal 111 and the third terminal 113 need to be connected individually to a terminal of the alternating-current power supply. For this reason, there is an issue that a piezoelectric device, such as a pump, including the piezoelectric element 400 as a drive source thereof is restricted in the degree of design freedom and is complicated to manufacture.

SUMMARY OF THE INVENTION

Preferred embodiments of the present invention have been developed to overcome the problems of the above-described existing piezoelectric element.

A piezoelectric element according to a preferred embodiment of the present invention includes a piezoelectric body including a plurality of laminated piezoelectric layers, a plurality of ground electrodes provided between every other one of the piezoelectric layers of the piezoelectric body, a plurality of central electrodes provided between some of the piezoelectric layers of the piezoelectric body that do not include the ground electrodes, and located in respective central portions of the some of the piezoelectric layers, and a plurality of peripheral electrodes provided between the some of the piezoelectric layers of the piezoelectric body including the central electrodes, and surrounding the central electrodes. The piezoelectric body includes a surface provided with a first terminal, a second terminal, a third terminal, a fourth terminal, and a fifth terminal sequentially arranged in a line. The ground electrodes are extracted to the third terminal. Further, when the piezoelectric body is divided into a first portion and a second portion at an interlayer plane located at the center or approximate center in a lamination direction of the piezoelectric layers, the central electrodes provided in the first portion and the peripheral electrodes provided in the second portion are extracted to the first terminal and the fourth terminal, and the peripheral electrodes provided in the first portion and the central electrodes provided in the second portion are extracted to the second terminal and the fifth terminal, or the central electrodes provided in the first portion and the peripheral electrodes provided in the second portion are extracted to the second terminal and the fifth terminal, and the peripheral electrodes provided in the first portion and the central electrodes provided in the second portion are extracted to the first terminal and the fourth terminal.

During the polarization of the piezoelectric body, the third terminal may be connected to a ground. Further, at least one of the first terminal and the fourth terminal may be applied with a positive voltage, and at least one of the second terminal and the fifth terminal may be applied with a negative voltage. Alternatively, at least one of the first terminal and the fourth terminal may be applied with a negative voltage, and at least one of the second terminal and the fifth terminal may be applied with a positive voltage. As a result, piezoelectric layers of the piezoelectric body and sandwiched by the ground electrodes, and the central electrodes and the peripheral electrodes are each polarized in opposite directions between a central portion and a peripheral portion thereof.

Further, electrical connection between layers of the piezoelectric layers of the piezoelectric body may preferably be provided by filled vias formed by piercing holes in the piezoelectric layers and filling the holes with a conductive material.

For electrical connection by the filled vias between layers separated from each other by two or more of the piezoelectric layers interposed therebetween, the filled vias provided in adjacent ones of the piezoelectric layers may be arranged to be alternately shifted in position when viewed in the lamination direction of the piezoelectric layers. In this case, it is possible to prevent the deformation of the piezoelectric body due to serial formation of the filled vias in the lamination direction.

Further, for electrical connection by the filled vias between non-adjacent layers, a plurality of relay electrodes may preferably be provided between layers located between the non-adjacent layers. If the relay electrodes overlap when viewed in the lamination direction of the piezoelectric layers, the relay electrodes may preferably be arranged to each have a shape selected from two or more shapes, arranged to have the same shape and be alternately shifted in position, or arranged to have the same shape and be rotated. In this case, it is possible to dispersedly arrange bumps generated by the relay electrodes, when the piezoelectric body is viewed in the lamination direction of the piezoelectric layers, and thus, to prevent the deformation of the piezoelectric body due to the relay electrodes.

Further, the piezoelectric element according to a preferred embodiment of the present invention may preferably be mounted on or in a piezoelectric device body and function as a drive source of a piezoelectric device, such as a pump, a blower, or a fan, for example. In this case, an alternating-current power supply may preferably include one terminal connected to the third terminal of the piezoelectric element and the other terminal connected to both of the first terminal and the second terminal of the piezoelectric element or both of the fourth terminal and the fifth terminal of the piezoelectric element.

Further, the connection between the terminals of the alternating-current power supply and the first to fifth terminals may preferably be provided by metal terminal members, and the filled vias may not be provided in portions of respective surfaces of the first to fifth terminals in contact with the metal terminal members. In this case, it is possible to prevent the breakage or damage of the filled vias and the piezoelectric body due to the contact of the metal terminal members with the filled vias.

With the above-described configuration, the piezoelectric element according to various preferred embodiments of the present invention is easy to mount on or in a piezoelectric device, improves the degree of design freedom of the piezoelectric device, and simplifies the manufacture of the piezoelectric device. That is, the piezoelectric element according to various preferred embodiments of the present invention enables one terminal of the alternating-current power supply to be connected to the third terminal of the piezoelectric element, and enables the other terminal of the alternating-current power supply to be connected to both of the first terminal and the second terminal of the piezoelectric element or both of the fourth terminal and the fifth terminal of the piezoelectric element. The piezoelectric element according to various preferred embodiments of the present invention is therefore capable of making connections simpler as compared to the piezoelectric elements according to the related art, and is usable by connections at least two locations.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
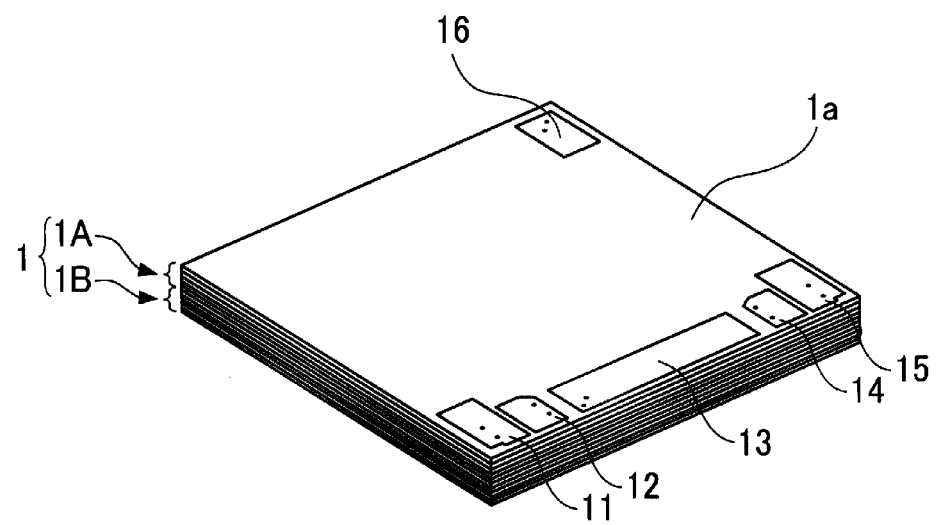
FIG. 1 is a perspective view illustrating a piezoelectric element according to a first preferred embodiment of the present invention.
Figure 2:
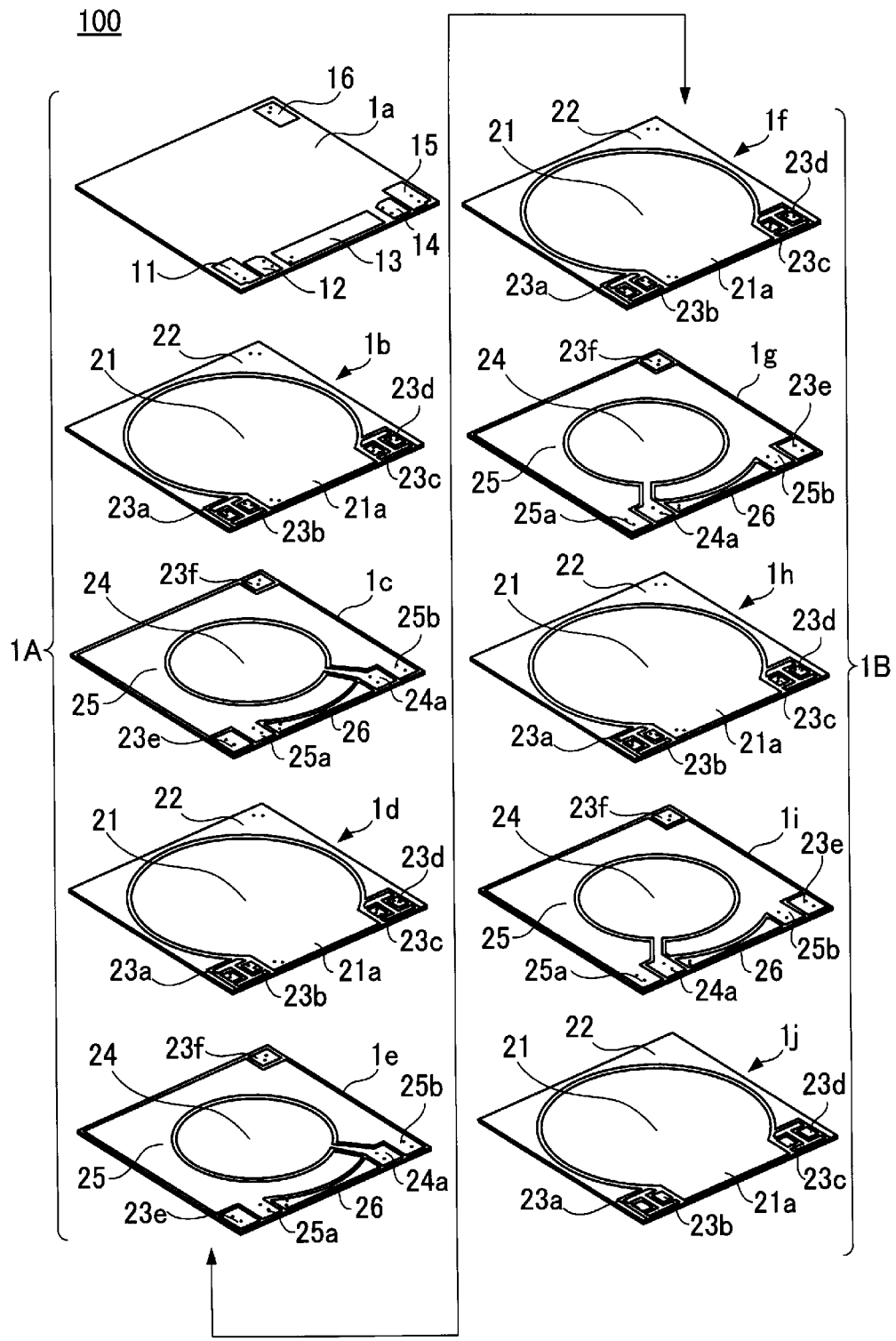
FIG. 2 is an exploded perspective view of the piezoelectric element according to the first preferred embodiment of the present invention.

Preferred embodiments of the present invention will be described below with reference to the drawings.
First Preferred Embodiment FIGS. 1 and 2 illustrate a piezoelectric element 100 according to a first preferred embodiment of the present invention. FIG. 1 is a perspective view, and FIG. 2 is an exploded perspective view.

The piezoelectric element 100 includes a piezoelectric body 1 including a plurality of laminated piezoelectric layers 1a to 1j. For example, piezoelectric ceramics primarily made of PZT may preferably be used for the piezoelectric body 1.

On a surface of the piezoelectric body 1, i.e., a surface of the piezoelectric layer 1a laminated as the uppermost layer, a first terminal 11, a second terminal 12, a third terminal 13, a fourth terminal 14, and a fifth terminal 15 are provided in a line. Further, a dummy terminal 16 is provided on a portion spaced away from the first to fifth terminals 11-15. The first terminal 11, the second terminal 12, the third terminal 13, the fourth terminal 14, the fifth terminal 15, and the dummy terminal 16 are connected to the interior of the piezoelectric body 1 by filled vias, which are preferably formed by piercing holes in the piezoelectric layer 1a and filling the holes with a conductive substance. Although the filled vias (illustrated as black dots in the drawings) are not assigned with reference numerals in the drawings for better visibility, the connection relationship will be described where necessary in the following description. In the present preferred embodiment, the connection in each of connecting portions is preferably provided by two filled vias to increase the reliability of connection. However, the connection in each of connecting portions may be provided by a single filled via.

Further, a relatively large circular or substantially circular ground electrode 21 is provided in a central portion of a surface of the next piezoelectric layer 1b, and a ring-shaped dummy electrode 22 is provided therearound. The ground electrode 21 includes an extraction electrode 21a along one side of the piezoelectric layer 1b. Further, along the one side of the piezoelectric layer 1b, relay electrodes 23a and 23b are provided adjacent to one side of the extraction electrode 21a, and relay electrodes 23c and 23d are provided adjacent to the other side of the extraction electrode 21a. Further, through the filled vias provided in the piezoelectric layer 1a, the relay electrode 23a, the relay electrode 23b, the extraction electrode 21a, the relay electrode 23c, the relay electrode 23d, and the dummy electrode 22 are connected to the first terminal 11, the second terminal 12, the third terminal 13, the fourth terminal 14, the fifth terminal 15, and the dummy terminal 16, respectively.

Further, a circular or substantially circular central electrode 24 is provided in a central portion of a surface of the next piezoelectric layer 1c, and a ring-shaped peripheral electrode 25 is provided therearound. The central electrode 24 includes an extraction electrode 24a along one side of the piezoelectric layer 1c. Further, the peripheral electrode 25 includes two extraction electrodes 25a and 25b along the same side of the piezoelectric layer 1c, along which the extraction electrode 24a is provided, with the extraction electrode 24a interposed therebetween. Furthermore, a ground relay electrode 26 is provided between the extraction electrode 24a and the extraction electrode 25a. Further, a relay electrode 23e is provided adjacent to a side of the extraction electrode 25a farther from the ground relay electrode 26. As a result, the relay electrode 23e, the extraction electrode 25a, the ground relay electrode 26, the extraction electrode 24a, and the extraction electrode 25b are sequentially arranged along the one side of the piezoelectric layer 1c. Further, a relay electrode 23f is provided in a portion of the surface of the piezoelectric layer 1c diagonal to a portion provided with the relay electrode 23e. Further, by filled vias provided in the piezoelectric layer 1b, the relay electrode 23e, the extraction electrode 25a, the ground relay electrode 26, the extraction electrode 24a, the extraction electrode 25b, and the relay electrode 23f are connected to the relay electrode 23a, the relay electrode 23b, the extraction electrode 21a, the relay electrode 23c, the relay electrode 23d, and the dummy electrode 22, respectively.

The next piezoelectric layer 1d includes the same electrode patterns as those of the above-described piezoelectric layer 1b. A surface of the piezoelectric layer 1d is provided with a ground electrode 21, an extraction electrode 21a, a dummy electrode 22, and relay electrodes 23a, 23b, 23c, and 23d. Further, via filled vias provided in the piezoelectric layer 1c, the relay electrode 23a, the relay electrode 23b, the extraction electrode 21a, the relay electrode 23c, the relay electrode 23d, and the dummy electrode 22 are connected to the relay electrode 23e, the extraction electrode 25a, the ground relay electrode 26, the extraction electrode 24a, the extraction electrode 25b, and the relay electrode 23f, respectively.

The next piezoelectric layer 1e preferably includes the same or substantially the same electrode patterns as those of the above-described piezoelectric layer 1c. A surface of the piezoelectric layer 1e includes a central electrode 24, an extraction electrode 24a, a peripheral electrode 25, extraction electrodes 25a and 25b, a ground relay electrode 26, and relay electrodes 23e and 23f. Further, by filled vias provided in the piezoelectric layer 1d, the relay electrode 23e, the extraction electrode 25a, the ground relay electrode 26, the extraction electrode 24a, the extraction electrode 25b, and the relay electrode 23f are connected to the relay electrode 23a, the relay electrode 23b, the extraction electrode 21a, the relay electrode 23c, the relay electrode 23d, and the dummy electrode 22, respectively.

The next piezoelectric layer 1f preferably includes the same or substantially the same electrode patterns as those of the above-described piezoelectric layers 1b and 1d. A surface of the piezoelectric layer 1f includes a ground electrode 21, an extraction electrode 21a, a dummy electrode 22, and relay electrodes 23a, 23b, 23c, and 23d. Further, through the filled vias provided in the piezoelectric layer 1e, the relay electrode 23a, the relay electrode 23b, the extraction electrode 21a, the relay electrode 23c, the relay electrode 23d, and the dummy electrode 22 are connected to the relay electrode 23e, the extraction electrode 25a, the ground relay electrode 26, the extraction electrode 24a, the extraction electrode 25b, and the relay electrode 23f, respectively.

Further, a surface of the next piezoelectric layer 1g includes a central electrode 24, an extraction electrode 24a, a peripheral electrode 25, extraction electrodes 25a and 25b, a ground relay electrode 26, and relay electrodes 23e and 23f, similarly to the above-described piezoelectric layers 1c and 1e, but is different in arrangement (i.e., different in the order of the electrodes) of some of the electrodes from the piezoelectric layers 1c and 1e. That is, the extraction electrode 25a, the extraction electrode 24a, the ground relay electrode 26, the extraction electrode 25b, and the relay electrode 23e are sequentially arranged along one side of the piezoelectric layer 1g. Further, by filled vias provided in the piezoelectric layer 1f, the extraction electrode 25a, the extraction electrode 24a, the ground relay electrode 26, the extraction electrode 25b, the relay electrode 23e, and the relay electrode 23f are connected to the relay electrode 23a, the relay electrode 23b, the extraction electrode 21a, the relay electrode 23c, the relay electrode 23d, and the dummy electrode 22, respectively.

The next piezoelectric layer 1h preferably includes the same or substantially the same electrode patterns as those of the above-described piezoelectric layers 1b, 1d, and 1f. A surface of the piezoelectric layer 1h includes a ground electrode 21, an extraction electrode 21a, a dummy electrode 22, and relay electrodes 23a, 23b, 23c, and 23d. Further, through the filled vias provided in the piezoelectric layer 1g, the relay electrode 23a, the relay electrode 23b, the extraction electrode 21a, the relay electrode 23c, the relay electrode 23d, and the dummy electrode 22 are connected to the extraction electrode 25a, the extraction electrode 24a, the ground relay electrode 26, the extraction electrode 25b, the relay electrode 23e, and the relay electrode 23f, respectively.

The next piezoelectric layer 1i preferably includes the same or substantially the same electrode patterns as those of the above-described piezoelectric layer 1g. A surface of the piezoelectric layer 1i includes a central electrode 24, an extraction electrode 24a, a peripheral electrode 25, extraction electrodes 25a and 25b, a ground relay electrode 26, and relay electrodes 23e and 23f. Further, through the filled vias provided in the piezoelectric layer 1h, the extraction electrode 25a, the extraction electrode 24a, the ground relay electrode 26, the extraction electrode 25b, the relay electrode 23e, and the relay electrode 23f are connected to the relay electrode 23a, the relay electrode 23b, the extraction electrode 21a, the relay electrode 23c, the relay electrode 23d, and the dummy electrode 22, respectively.

The next piezoelectric layer 1j preferably includes the same or substantially the same electrode patterns as those of the above-described piezoelectric layers 1b, 1d, 1f, and 1h. A surface of the piezoelectric layer 1j includes a ground electrode 21, an extraction electrode 21a, a dummy electrode 22, and relay electrodes 23a, 23b, 23c, and 23d. Further, through the filled vias provided in the piezoelectric layer 1i, the relay electrode 23a, the relay electrode 23b, the extraction electrode 21a, the relay electrode 23c, the relay electrode 23d, and the dummy electrode 22 are connected to the extraction electrode 25a, the extraction electrode 24a, the ground relay electrode 26, the extraction electrode 25b, the relay electrode 23e, and the relay electrode 23f, respectively.

As a result, in the piezoelectric body 1, across an interlayer plane between the piezoelectric layers 1e and 1f corresponding to the center or the approximate center in the lamination direction of the piezoelectric layers 1a to 1j, the central electrodes 24 provided in a first portion 1A (the piezoelectric layers 1a to 1e) corresponding to the upper half and the peripheral electrodes 25 provided in a second portion 1B (the piezoelectric layers 1f to 1j) corresponding to the lower half are connected to the first terminal 11 and the fourth terminal 14. Further, the peripheral electrodes 25 provided in the first portion 1A and the central electrodes 24 provided in the second portion 1B are connected to the second terminal 12 and the fifth terminal 15. Furthermore, all of the ground electrodes 21 provided in the piezoelectric body 1 are connected to the third terminal 13. Further, all of the dummy terminals 22 provided in the piezoelectric body 1 are connected to the dummy terminal 16.

With a change in extraction of the electrodes, the central electrodes 24 provided in the first portion 1A and the peripheral electrodes 25 provided in the second portion 1B may be connected to the second terminal 12 and the fifth terminal 15, and the peripheral electrodes 25 provided in the first portion 1A and the central electrodes 24 provided in the second portion 1B may be connected to the first terminal 11 and the fourth terminal 14.

The piezoelectric body 1 having the above-described structure is preferably formed by a method of, for example, forming, laminating, compressing, and firing, with a predetermined profile, piezoelectric green sheets for forming the piezoelectric layers 1a to 1j, which are applied with conductive paste on respective surfaces thereof, formed with the necessary terminals (the first terminal 11, the second terminal 12, the third terminal 13, the fourth terminal 14, the fifth terminal 15, and the dummy terminal 16) and the necessary electrodes (the ground electrodes 21, the extraction electrodes 21a, the dummy electrodes 22, the central electrodes 24, the extraction electrodes 24a, the relay electrodes 23a, 23b, 23c, 23d, 23e, and 23f, the peripheral electrodes 25, the extraction electrodes 25a and 25b, and the ground relay electrodes 26), and formed with the necessary filled vias formed by piecing holes and filling the holes with conductive paste.

Figure 3A:
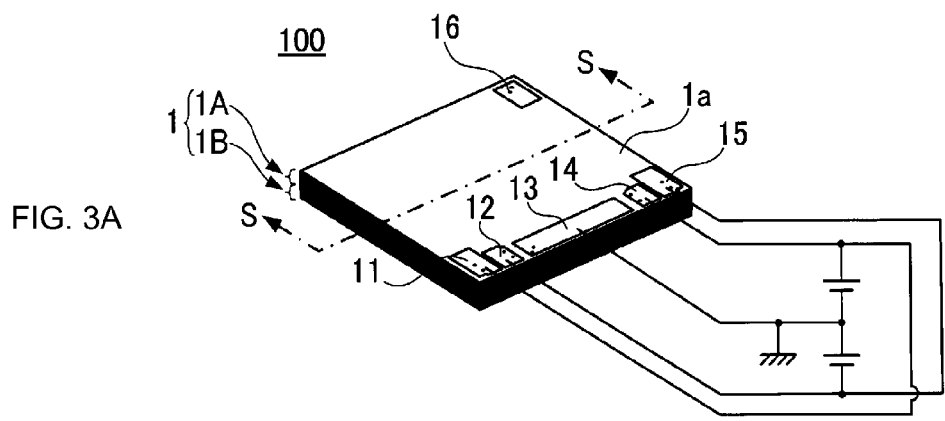
FIGS. 3A and 3B are explanatory diagrams illustrating a polarization process in the manufacture of the piezoelectric element according to the first preferred embodiment of the present invention, FIG. 3B illustrating a portion of FIG. 3A indicated by a dash-dotted line S-S.
Figure 3B:
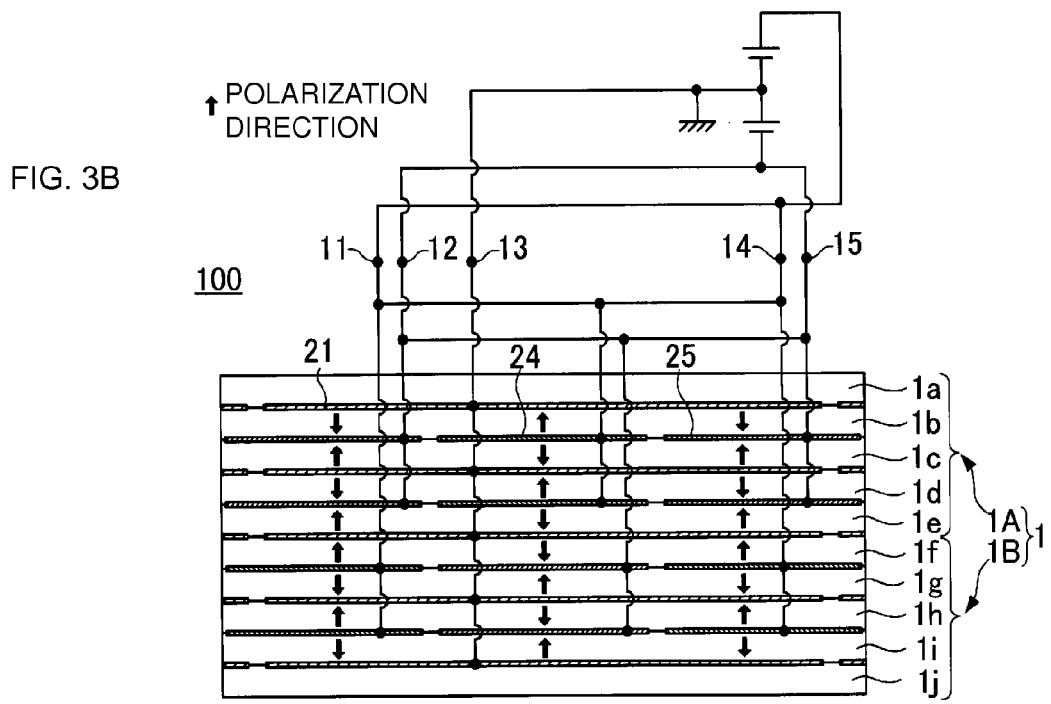

FIGS. 3A and 3B are explanatory diagrams illustrating a polarization process of the piezoelectric element 100, and FIG. 3B illustrates a portion of FIG. 3A indicated by a dash-dotted line S-S. In FIG. 3B, the scale in the height direction is enlarged as compared to that in the width direction to clarify polarization directions.

As illustrated in FIGS. 3A and 3B, during the polarization of the piezoelectric element 100, the first terminal 11 and the fourth terminal 14 are applied with a positive voltage, and the second terminal 12 and the fifth terminal 15 are applied with a negative voltage, with the third terminal 13 connected to a ground. The positive voltage is preferably selected from a range of about 30 V to about 50 V, for example, and the negative voltage is preferably selected from a range of about −50 V to about −30 V, for example. The time of application preferably ranges from about 1 second to about 120 seconds, for example. The dummy terminal 16 is not used in the polarization process. The positive voltage and the negative voltage to be applied may be reversed to apply the negative voltage to the first terminal 11 and the fourth terminal 14 and the positive voltage to the second terminal 12 and the fifth terminal 15.

As a result, as illustrated in FIG. 3B, each of the piezoelectric layers 1b to 1i of the piezoelectric body 100 is polarized in the directions indicated by arrows in FIG. 3B. The piezoelectric layer 1a defining the uppermost layer and the piezoelectric layer 1j defining the lowermost layer are not polarized.

As understood from FIG. 3B, in each of the piezoelectric layers 1b to 1i, the polarization direction is opposite between the central portion and the peripheral portion. Further, the central electrodes 24 provided in the first portion 1A and the peripheral electrodes 25 provided in the second portion 1B are connected to the first terminal 11 and the fourth terminal 14, and the peripheral electrodes 25 provided in the first portion 1A and the central electrodes 24 provided in the second portion 1B are connected to the second terminal 12 and the fifth terminal 15. Therefore, the repeating order of polarization is different between the piezoelectric layers 1b to 1e of the first portion 1A and the piezoelectric layers 1f to 1i of the second portion 1B.

Figure 4A:
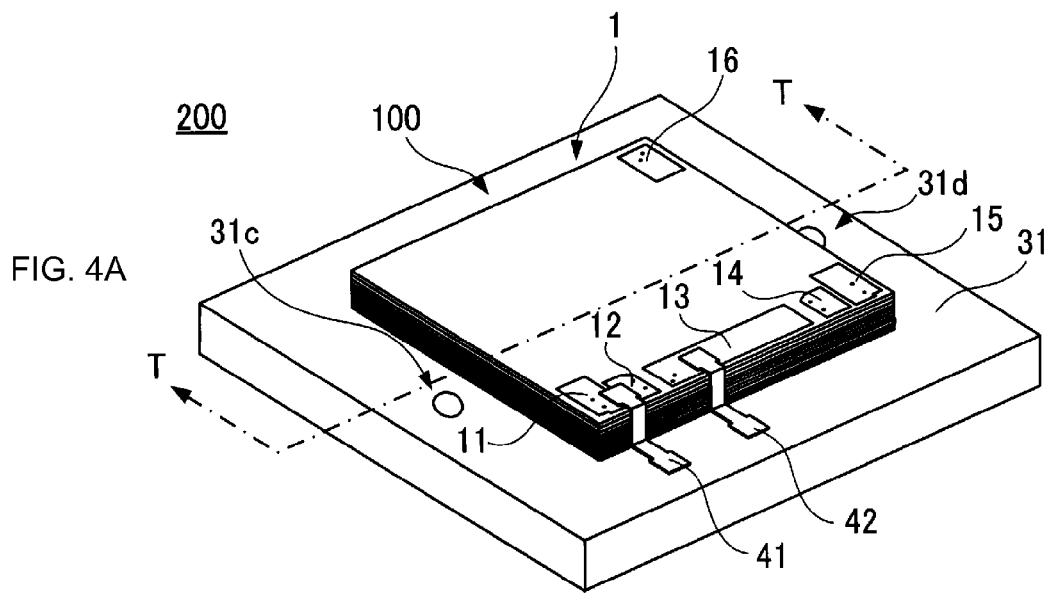
FIG. 4A is a perspective view illustrating a piezoelectric pump, which is a piezoelectric device according to the first preferred embodiment of the present invention using the piezoelectric element illustrated in FIGS. 1 to 3B as a drive source thereof.
Figure 4B:
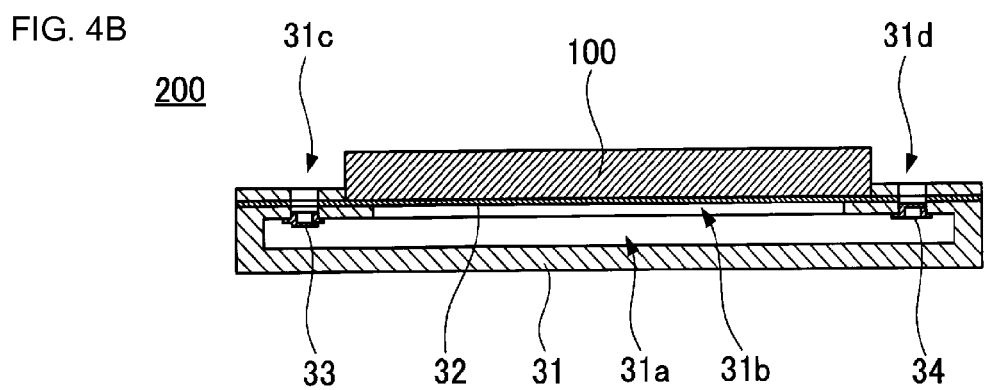
FIG. 4B is a cross-sectional view of the piezoelectric pump, illustrating a portion of FIG. 4A indicated by a dash-dotted line T-T.

The piezoelectric element 100 having such a structure and subjected to polarization is preferably used as, for example, a drive source of a piezoelectric device, such as a piezoelectric pump, for example. FIGS. 4A and 4B illustrate a piezoelectric pump 200 according to the first preferred embodiment of the present invention using the piezoelectric element 100 as a drive source thereof. FIG. 4A is a perspective view, and FIG. 4B is a cross-sectional view illustrating a portion of FIG. 4A indicated by a dash-dotted line T-T.

The piezoelectric pump 200 includes a pump body 31. The pump body 31 includes a hollow pump chamber 31a, an opening 31b that opens an upper portion of the pump chamber 31a, and two holes 31c and 31d that communicate with the pump chamber 31a.

The opening 31b is closed by a diaphragm 32, and the piezoelectric element 100 is bonded and fixed to the diaphragm 32.

Further, an inflow check valve 33 is attached to the hole 31c, and an outflow check valve 34 is attached to the hole 31d. The inflow check valve 33 functions to allow fluid to flow into the pump chamber 31a from the outside but prevent fluid from flowing out in the opposite direction. The outflow check valve 34 functions to allow fluid to flow to the outside from the pump chamber 31a but prevent fluid from flowing in in the opposite direction.

Further, two metal terminal members 41 and 42 are provided on the upper surface of the pump body 31. Further, with a bonding material, such as conductive paste or solder, for example, the metal terminal member 41 is connected to the first terminal 11 and the second terminal 12 of the piezoelectric element 100, and the metal terminal member 42 is connected to the third terminal 13, respectively. Meanwhile, the fourth terminal 14 and the fifth terminal 15 are not connected to a metal terminal member (the illustration of the bonding material is omitted in FIG. 4A).

Figure 5A:
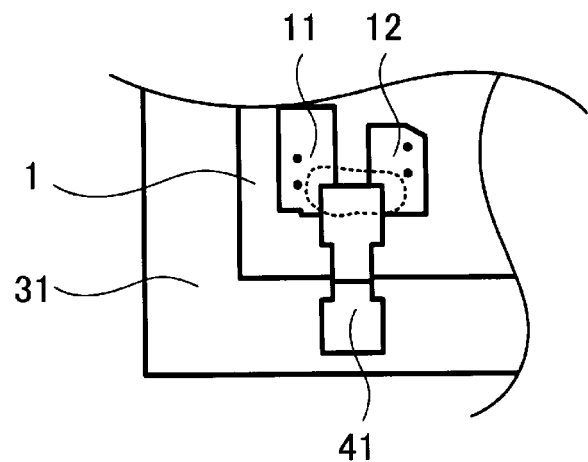
FIG. 5A is a partial plan view illustrating a connecting portion between a first terminal and a second terminal and a metal terminal member in the piezoelectric pump according to the first preferred embodiment of the present invention.

FIG. 5A illustrates a connection state of the metal terminal member 41, the first terminal 11, and the second terminal 12. The metal terminal member 41 is in partial contact with both the first terminal 11 and the second terminal 12. In this case, it is preferable that the metal terminal member 41 is not in contact with respective portions of the first terminal 11 and the second terminal 12 including filled vias (illustrated as black dots in the drawing). This is to prevent breakage or damage of the filled vias and the piezoelectric body 1 due to the contact of the metal terminal member 41 with the filled vias. Further, in FIGS. 5A to 5C, a bonding material, such as conductive paste, for example, is applied to a portion encircled by a chain line, and thus, the first terminal 11, the second terminal 12, and the metal terminal member 41 are connected.

Figure 5B:
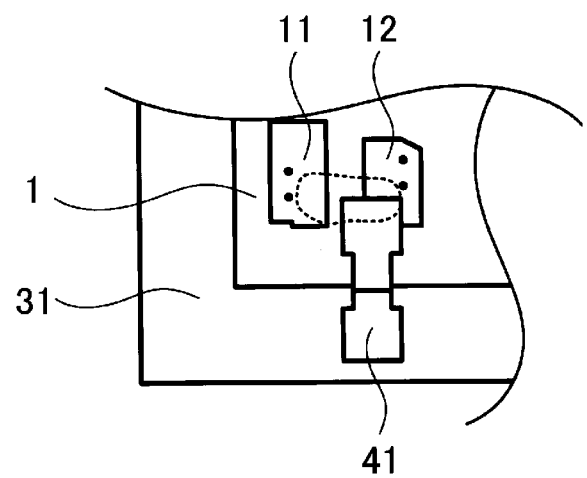
FIGS. 5B and 5C illustrate modified examples.
Figure 5C:
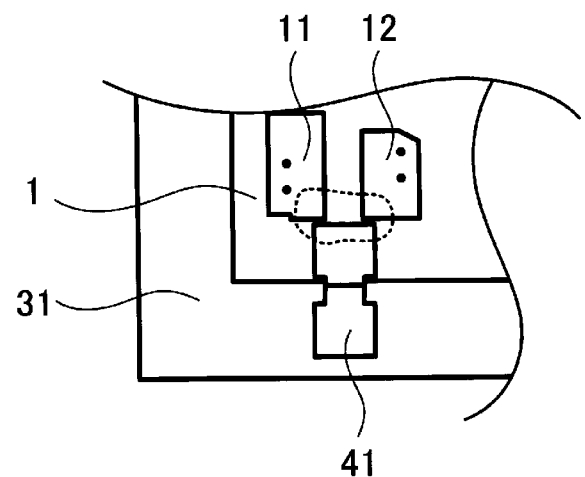

FIGS. 5B and 5C illustrate modified examples of the connection of the first terminal 11, the second terminal 12, and the metal terminal member 41. As illustrated in FIG. 5B, the metal terminal member 41 may be configured to be in contact only with one of the terminals, e.g., the second terminal 12, and may be connected to the first terminal 11 as the other terminal by a bonding material. Alternatively, as illustrated in FIG. 5C, the metal terminal member 41 may be configured not to be in contact with either of the two terminals, i.e., the first terminal 11 and the second terminal 12, and may be connected thereto by a bonding material.

Figure 6A:
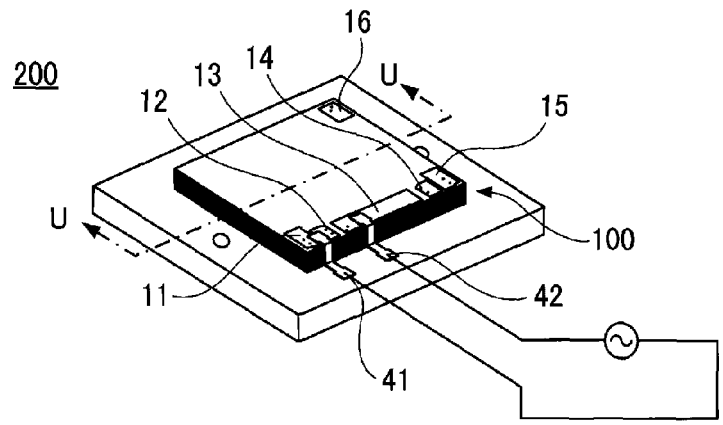
FIGS. 6A to 6C are explanatory diagrams illustrating a state of use of the piezoelectric pump according to the first preferred embodiment of the present invention, FIGS. 6B and 6C illustrating the piezoelectric element corresponding to a portion of FIG. 6A indicated by a dash-dotted line U-U.
Figure 6B:
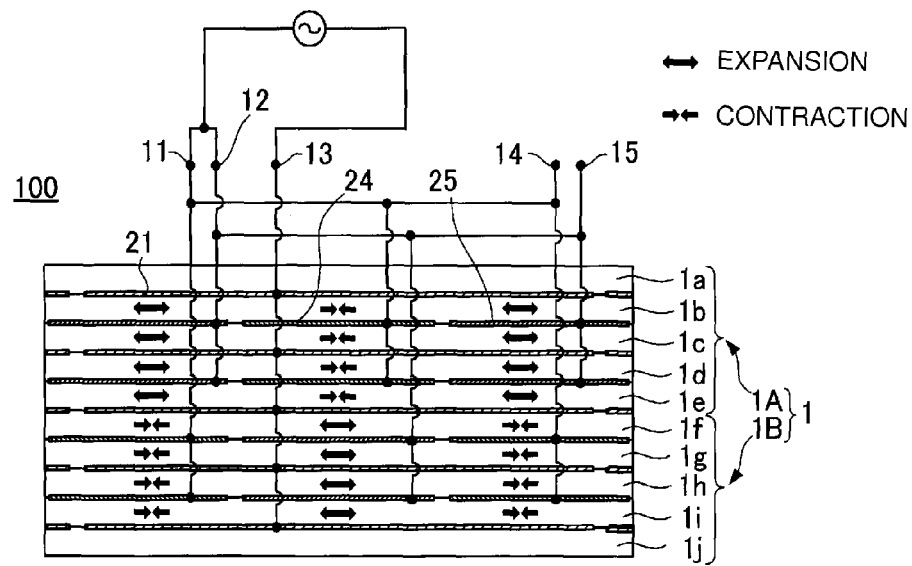
Figure 6C:
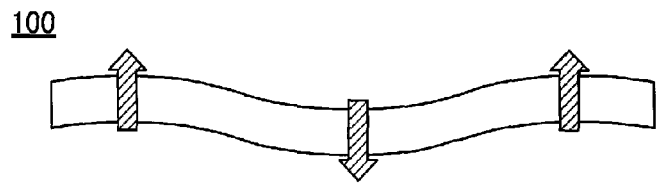

FIGS. 6A to 6C illustrate a drive state of the piezoelectric pump 200. FIGS. 6A to 6C are explanatory diagrams, and FIGS. 6B and 6C illustrate a portion of the piezoelectric element 100 in FIG. 6A indicated by a dash-dotted line U-U. In FIG. 6B, the scale in the height direction is enlarged as compared to that in the width direction to clarify the expansion and contraction in the piezoelectric layers 1a to 1j defining the piezoelectric element 100.

As illustrated in FIGS. 6A and 6B, to drive the piezoelectric pump 200, the piezoelectric element 100 includes an alternating-current power supply as a drive power supply and including one terminal connected to the third terminal 13 via the metal terminal member 42 and the other terminal connected to the first terminal 11 and the second terminal 12 via the metal terminal member 41. As the alternating-current power supply, a power supply that generates an alternating-current voltage of about 1 V to about 20 V, for example, is preferably used. The alternating-current power supply is not limited to one that generates sine waves, and may be one that generates, for example, rectangular waves.

The piezoelectric layers 1a to 1j of the piezoelectric body 1 of the piezoelectric element 100 are polarized, as illustrated in FIG. 3B (however, the piezoelectric layer 1a defining the uppermost layer and the piezoelectric layer 1j defining the lowermost layer are not polarized). Therefore, when an alternating-current voltage is applied thereto, the piezoelectric body 1 partially expands or contracts at some point of time, as indicated by arrows in FIG. 6B, for example. At this point of time, for example, a central portion of the piezoelectric layers 1b to 1e contracts, and a peripheral portion located therearound expands. Meanwhile, a central portion of the piezoelectric layers 1f to 1i expands, and a peripheral portion located therearound contracts. As a result, the piezoelectric element 100 includes a central portion that is downwardly bent and displaced and a peripheral portion that is upwardly bent and displaced, as indicated by hatched arrows in FIG. 6C.

Then, the polarity of the alternating-current power supply changes and the piezoelectric element 100 exhibits an opposite behavior to that illustrated in FIGS. 6B and 6C. That is, the central portion of the piezoelectric layers 1b to 1e expands, and the peripheral portion located therearound contracts. Further, the central portion of the piezoelectric layers 1f to 1i contracts, and the peripheral portion located therearound expands. Then, the piezoelectric element 100 includes the central portion that is upwardly bent and displaced and the peripheral portion that is downwardly bent and displaced.

When the alternating-current voltage is applied, the piezoelectric element 100 repeats these behaviors. As a result, in the piezoelectric pump 200 illustrated in FIGS. 4A and 4B, fluid flows into the pump chamber 31*a* through the hole 31*c*, and the fluid flown into the pump chamber 31*a* flows to the outside through the hole 31*d*.

In the piezoelectric element 100 according to the present preferred embodiment, the piezoelectric body 1 preferably includes multiple layers of the piezoelectric layers 1*a* to 1*j*, and each of the piezoelectric layers 1*b* to 1*i* is polarized in opposite directions between the central portion and the peripheral portion. It is therefore possible to drive the piezoelectric element 100 with a relatively low voltage, and to obtain a large displacement amount at the central portion of the piezoelectric element 100. Accordingly, the piezoelectric pump 200 according to the present preferred embodiment that includes the piezoelectric element 100 as a drive source thereof efficiently functions with low power consumption. Further, the central electrode 24 and the peripheral electrode 25 provided on the same layer are constantly applied with the same potential. Therefore, no electromigration occurs therebetween, and no short circuit occurs therebetween.

Further, the piezoelectric element 100 is capable of being driven only by the connection of the two metal terminal members 41 and 42, and does not require the connection of three metal terminal members, unlike the existing piezoelectric element 400. Therefore, the piezoelectric element 100 is easy to mount. Further, the piezoelectric pump 200 including the piezoelectric element 100 as a drive source thereof has an improved degree of design freedom, and a simplified manufacturing process.

The description has been provided above of the piezoelectric element 100 according to the first preferred embodiment and the piezoelectric pump 200 according to the first preferred embodiment including the piezoelectric element 100 as a drive source thereof. However, preferred embodiments of the present invention are not limited to the description above, and may be modified in various ways within the scope of the present invention.

For example, the piezoelectric element 100 preferably includes the first portion 1A including five layers of the piezoelectric layers 1*a* to 1*e* and the second portion 1B including five layers of the piezoelectric layers 1*f* to 1*j*, as illustrated in, for example, FIG. 2. However, the number of layers is not limited thereto, and may be increased or reduced. For example, to increase the number of layers in the first portion 1*a*, the piezoelectric layers 1*b* and 1*c* may be paired, and a desired number of pairs thereof may be added under the piezoelectric layer 1*a*, for example. Further, to increase the number of layers in the second portion 1B, the piezoelectric layers 1*f* and 1*g* may be paired, and a desired number of pairs thereof may be added under the piezoelectric layer 1*e*, for example.

Figure 7:
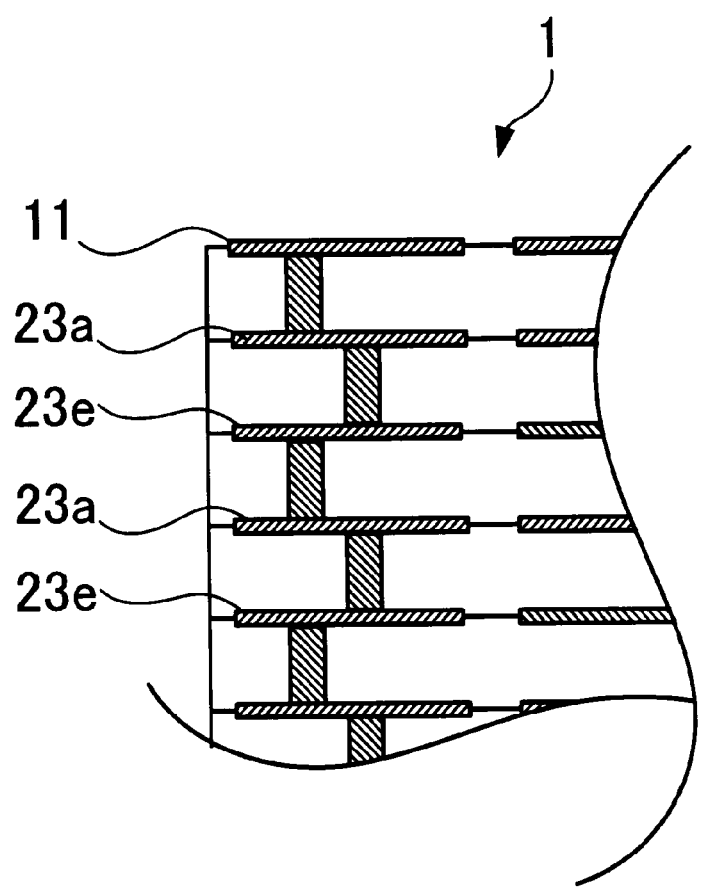
FIG. 7 is a partial cross-sectional view illustrating a modified example of the piezoelectric element according to the first preferred embodiment of the present invention.

Further, for example, when the plurality of relay electrodes 23*a* and 23*e* are alternately connected by the filled vias in the lamination direction, as illustrated in FIG. 2, the filled vias may preferably be arranged so as not to overlap each other but to be alternately shifted, as illustrated in FIG. 7, when viewed in the lamination direction. In this case, it is possible to prevent the deformation of the piezoelectric body 1 due to serial formation of the filled vias in the lamination direction.

Figure 8A:
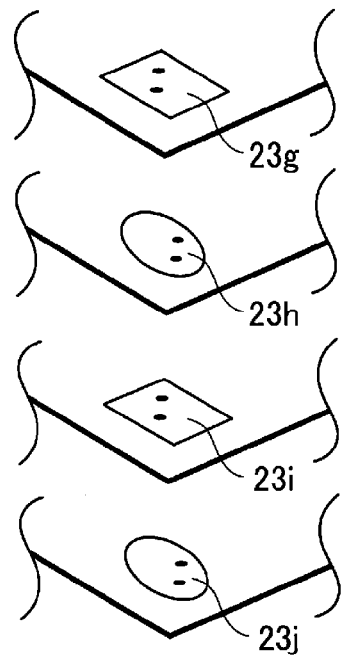
FIGS. 8A to 8C are partial cross-sectional views illustrating modified examples of the piezoelectric element according to the first preferred embodiment of the present invention.
Figure 8B:
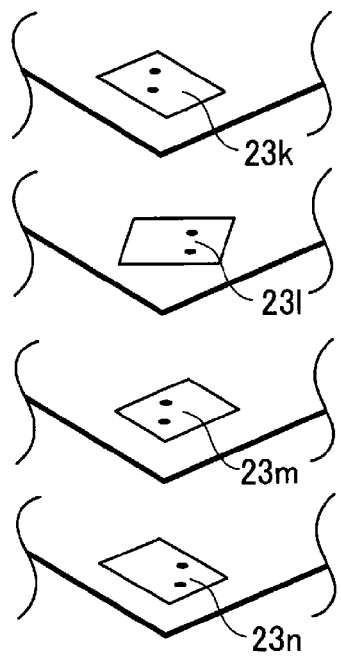
Figure 8C:
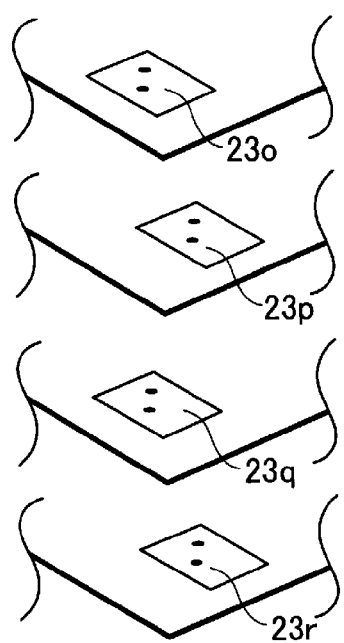

Further, as to the respective shapes and formation positions of the relay electrodes, instead of the relay electrodes having the same or substantially the same uniform shape laminated in the vertical direction, a rectangular relay electrode 23*g*, a circular relay electrode 23*h*, a rectangular relay electrode 23*i*, and a circular relay electrode 23*j*, for example, may be provided, as illustrated in FIG. 8A. Further, as illustrated in FIG. 8B, relay electrodes 23*k* to 23*n* having a given shape, such as a rectangular shape, for example, each rotated by a predetermined angle may be provided. Further, as illustrated in FIG. 8C, relay electrodes 23*o* to 23*r* having a given shape, such as a rectangular shape, for example, each shifted in the horizontal direction may be provided. In this case, it is possible to prevent bumps generated by the formation of the relay electrodes from accumulating at the same location and generating a large bump on a surface of the piezoelectric element. Accordingly, it is possible to prevent the deformation of the piezoelectric body due to the formation of the relay electrodes.

Further, as illustrated in FIGS. 6A and 6B, in the piezoelectric pump 200 according to the present preferred embodiment, the alternating-current power supply defining a drive source includes one terminal connected to the third terminal 13 and the other terminal connected to the first terminal 11 and the second terminal 12. However, the other terminal of the alternating-current power supply may be connected to the fourth terminal 14 and the fifth terminal 15 instead of the first terminal 11 and the second terminal 12.

Further, the piezoelectric device including the piezoelectric element 100 as a drive source thereof is not limited to a piezoelectric pump, and may be a piezoelectric blower or a piezoelectric fan, for example.

Second Preferred Embodiment

Figure 9:
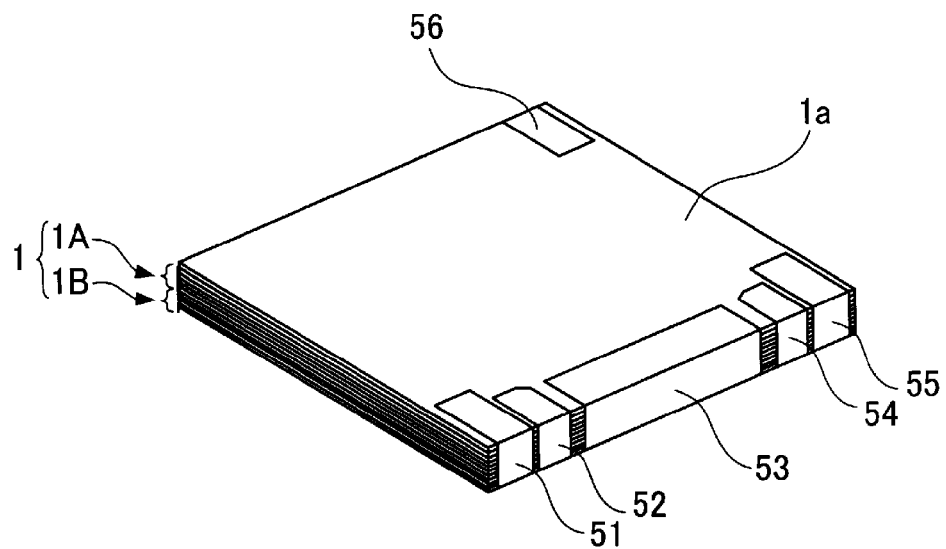
FIG. 9 is a perspective view illustrating a piezoelectric element according to a second preferred embodiment of the present invention.
Figure 10:
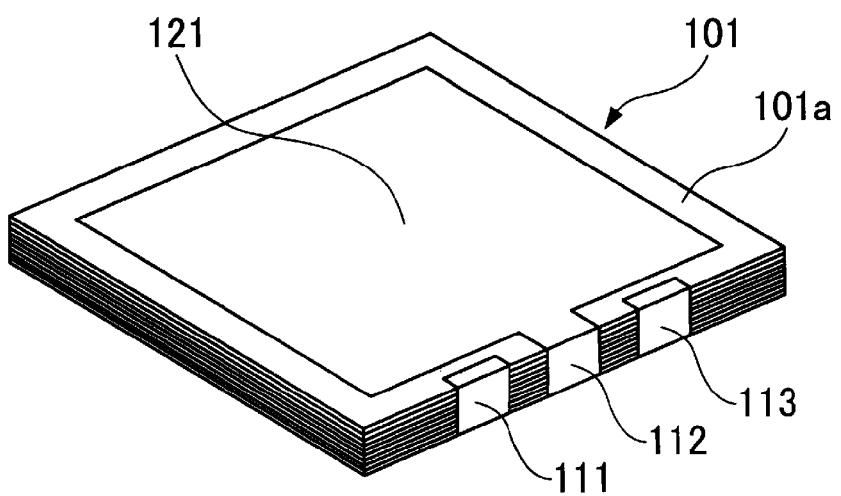
FIG. 10 is a perspective view illustrating an existing piezoelectric element.
Figure 11:
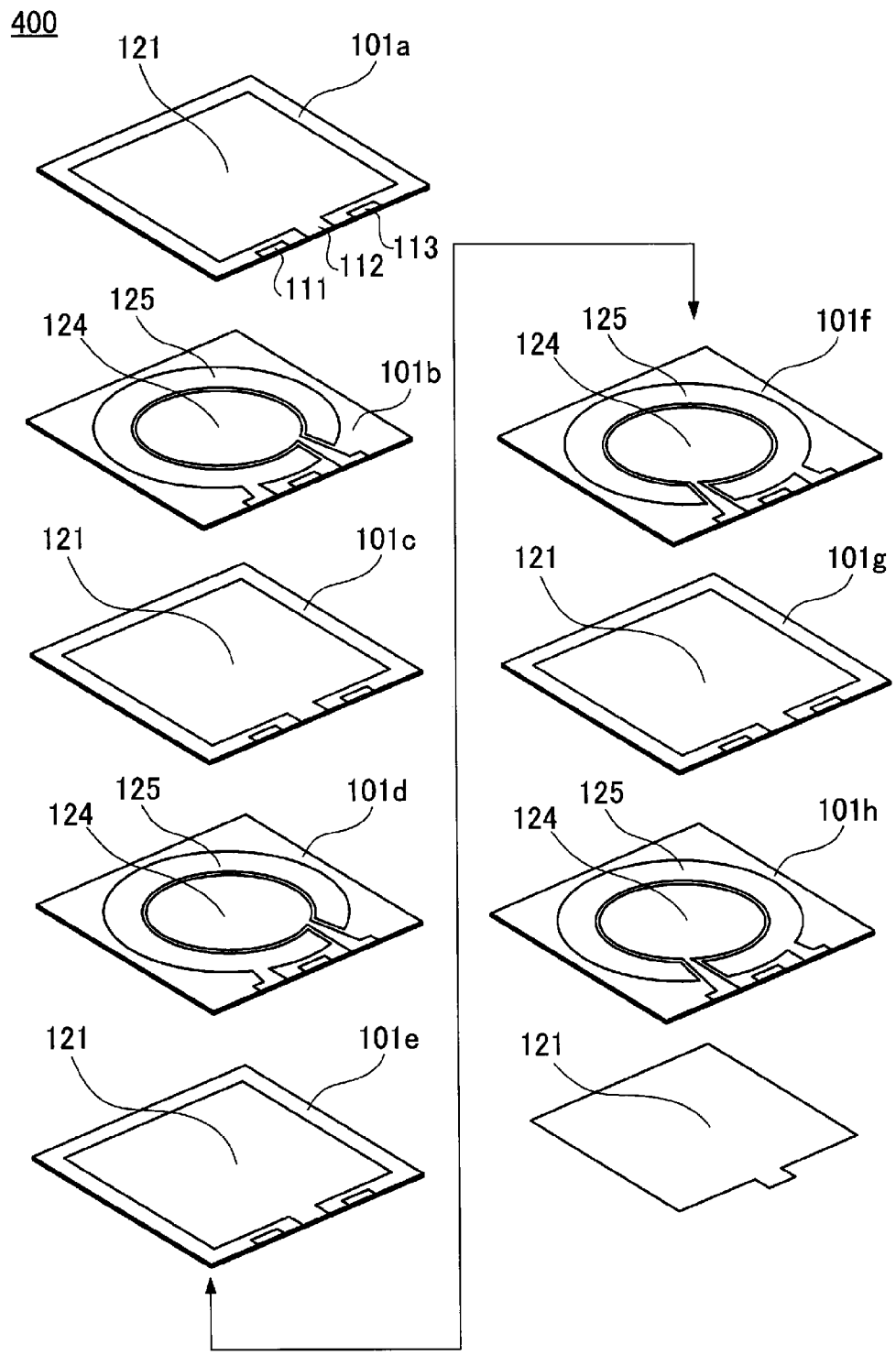
FIG. 11 is an exploded perspective view of the existing piezoelectric element.
Figure 12A:
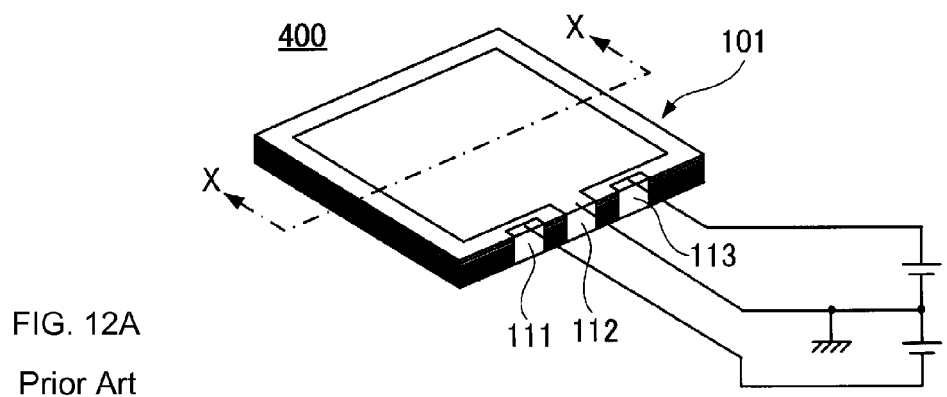
FIGS. 12A and 12B are explanatory diagrams illustrating a polarization process in the manufacture of the existing piezoelectric element, FIG. 12B illustrating a portion of FIG. 12A indicated by a dash-dotted line X-X.
Figure 12B:
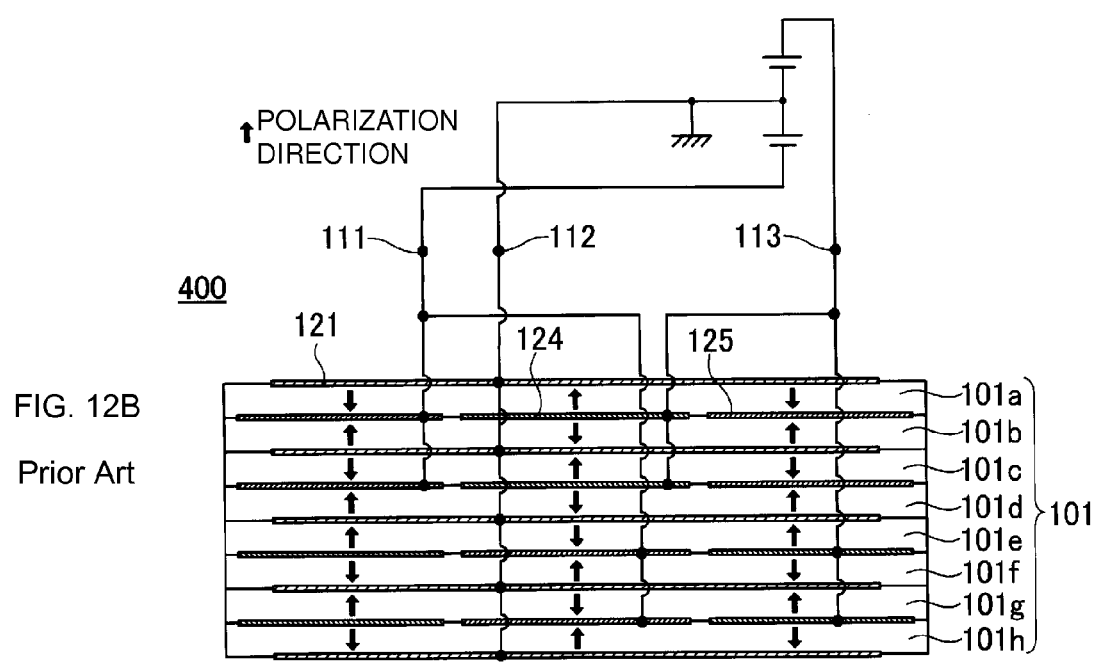
Figure 13A:
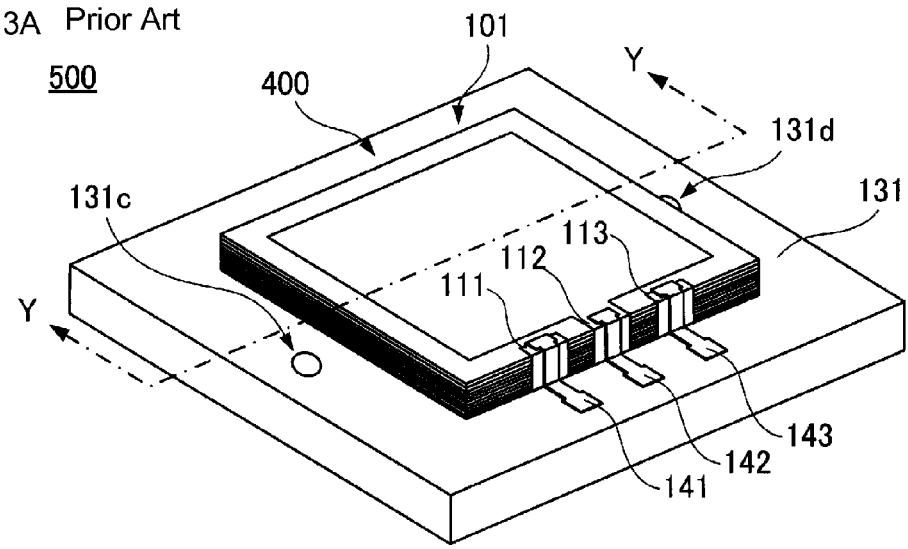
FIG. 13A is a perspective view illustrating an existing piezoelectric pump including the existing piezoelectric element illustrated in FIGS. 10 to 12B as a drive source thereof.
Figure 13B:
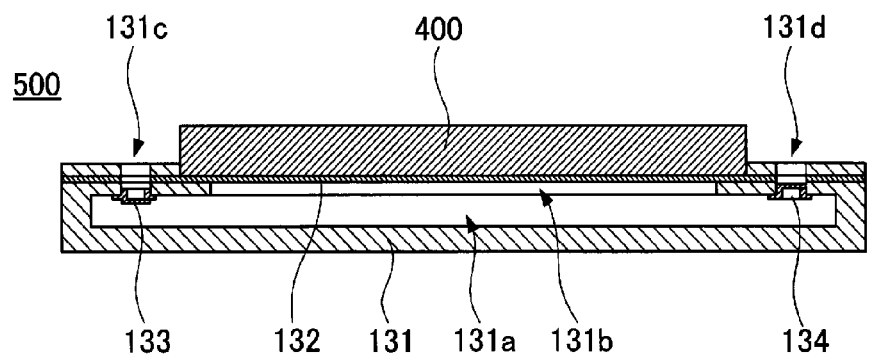
FIG. 13B is a cross-sectional view illustrating the existing piezoelectric pump, illustrating a portion of FIG. 13A indicated by a dash-dotted line Y-Y.
Figure 14A:
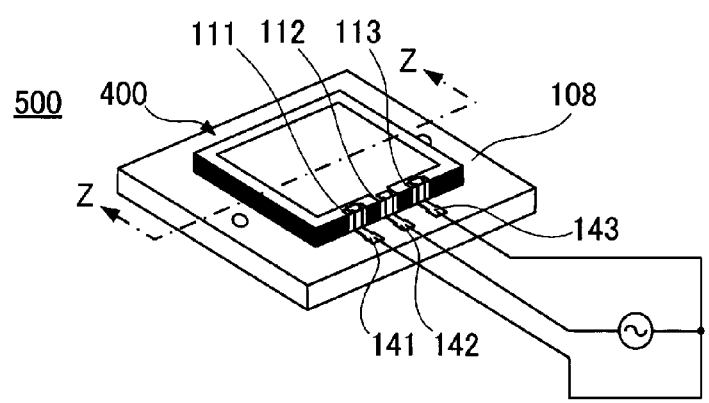
FIGS. 14A to 14C are explanatory diagrams illustrating a state of use of the existing piezoelectric pump, FIGS. 14B and 14C illustrating the piezoelectric element 400 corresponding to a portion of FIG. 14A indicated by a dash-dotted line Z-Z.
Figure 14B:
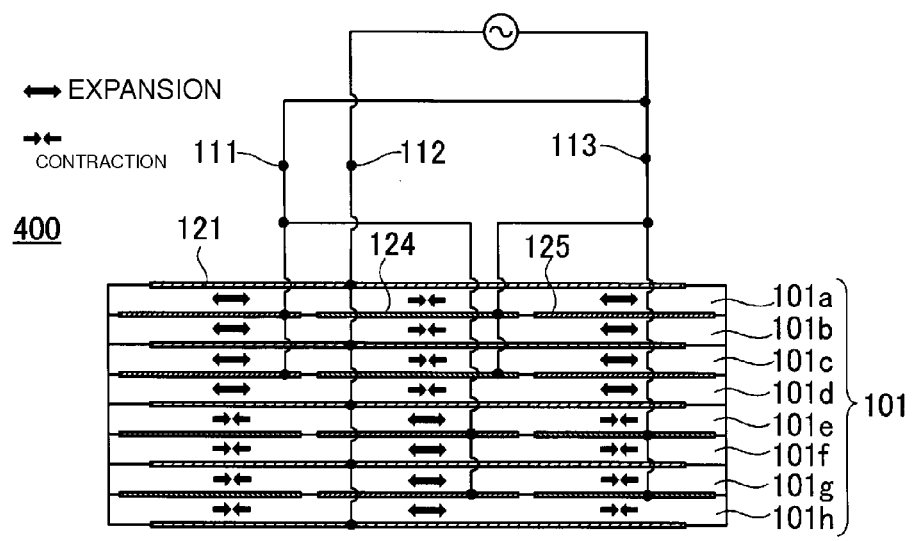
Figure 14C:
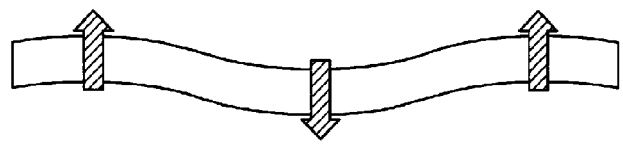

FIG. 9 illustrates a piezoelectric element 300 according to a second preferred embodiment of the present invention. FIG. 9 is a perspective view.

In the piezoelectric element 100 according to the first preferred embodiment, electrical connection between layers inside the piezoelectric body 1 is provided by the filled vias provided in the piezoelectric layers 1*a* to 1*i* (see, for example, FIGS. 1 and 2).

As illustrated in FIG. 9, in the piezoelectric element 300 according to the second preferred embodiment, electrical connection between layers is provided by a first terminal 51, a second terminal 52, a third terminal 53, a fourth terminal 54, a fifth terminal 55, and a dummy terminal 56 each provided on at least a side surface of the piezoelectric body 1, instead of the filled vias. Accordingly, each of the ground connection electrodes, the relay electrodes, and the extraction electrodes formed on the piezoelectric layers is arranged to be in contact with a side of the corresponding piezoelectric layer, although not illustrated. The remaining configurations of the piezoelectric element 300 according to the second preferred embodiment are preferably the same or substantially the same as those of the piezoelectric element 100 according to the first preferred embodiment.

As described above, in preferred embodiments of the present invention, electrical connection between layers may be provided by terminals each provided on a side surface of the piezoelectric body 1, instead of by the filled vias.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric element comprising:
   a piezoelectric body including a plurality of laminated piezoelectric layers;
   a plurality of ground electrodes provided between every other one of the plurality of piezoelectric layers;
   a plurality of central electrodes provided between at least two of the plurality of piezoelectric layers not provided with the ground electrodes, and located in respective central portions of the at least two of the plurality of piezoelectric layers; and a plurality of peripheral electrodes provided between the at least two of the plurality of piezoelectric layers provided with the central electrodes, and surrounding the central electrodes; wherein the piezoelectric body includes a surface provided with a first terminal, a second terminal, a third terminal, a fourth terminal, and a fifth terminal sequentially arranged in a line;

the plurality of ground electrodes are extracted to the third terminal; and when the piezoelectric body is divided into a first portion and a second portion at an interlayer plane located at a center or an approximate center in a lamination direction of the plurality of piezoelectric layers, the central electrodes provided in the first portion and the peripheral electrodes provided in the second portion are extracted to the first terminal and the fourth terminal, and the peripheral electrodes provided in the first portion and the central electrodes provided in the second portion are extracted to the second terminal and the fifth terminal, or the central electrodes provided in the first portion and the peripheral electrodes provided in the second portion are extracted to the second terminal and the fifth terminal, and the peripheral electrodes provided in the first portion and the central electrodes provided in the second portion are extracted to the first terminal and the fourth terminal.

2. The piezoelectric element according to claim 1, wherein at least two of the plurality of piezoelectric layers sandwiched by the ground electrodes, and the central electrodes and the peripheral electrodes are each polarized in opposite directions between a central portion and a peripheral portion thereof.

3. The piezoelectric element according to claim 1, wherein electrical connection between the plurality of piezoelectric layers is provided by vias defined by pierced holes in the plurality of piezoelectric layers that are filled with a conductive material.

4. The piezoelectric element according to claim 3, wherein, for electrical connection by the vias between piezoelectric layers separated from each other by two or more of the plurality of piezoelectric layers interposed therebetween, the vias provided in adjacent ones of the plurality of piezoelectric layers are arranged to be alternately shifted with respect to one another when viewed in the lamination direction of the piezoelectric layers.

5. The piezoelectric element according to claim 3, wherein, for electrical connection by the vias between non-adjacent layers of the plurality of piezoelectric layers, a plurality of relay electrodes are provided between layers of the plurality of piezoelectric layers located between the non-adjacent layers, and overlap when viewed in the lamination direction of the piezoelectric layers, and the plurality of relay electrodes are arranged to each have a shape selected from two or more shapes, arranged to have the same or substantially the same shape and be alternately shifted with respect to each other, or arranged to have the same or substantially the same shape and to be rotated with respect to one another.

6. A piezoelectric device comprising:
a piezoelectric device body; and
the piezoelectric element according to claim 2 mounted on or in the piezoelectric device body as a drive source; and
an alternating-current power supply including a first terminal connected to the third terminal of the piezoelectric element and a second terminal connected to both of the first terminal and the second terminal of the piezoelectric element or to both of the fourth terminal and the fifth terminal of the piezoelectric element.

7. The piezoelectric device according to claim 6, wherein the connection between the first and second terminals of the alternating-current power supply and the first to fifth terminals of the piezoelectric element is provided by metal terminal members, and the filled vias are not arranged in portions of respective surfaces of the first to fifth terminals in contact with the metal terminal members.

8. The piezoelectric device according to claim 6, wherein the piezoelectric device is a piezoelectric pump.

9. The piezoelectric element according to claim 1, wherein the plurality of piezoelectric layers are primarily made of PZT.

10. The piezoelectric element according to claim 1, further comprising a dummy provided on the surface of the piezoelectric body and spaced away from the first to fifth terminals.

11. The piezoelectric element according to claim 1, wherein the first to fifth terminals are arranged in a line along an edge of the piezoelectric body.

12. The piezoelectric element according to claim 1, wherein each of the plurality of ground electrodes has a circular or substantially circular shape.

13. The piezoelectric element according to claim 1, wherein each of the plurality of peripheral electrodes has a ring shape.

14. The piezoelectric element according to claim 1, wherein each of the plurality of central electrodes has a circular or substantially circular shape.

15. The piezoelectric element according to claim 1, wherein each of the plurality of ground electrodes includes an extraction electrode connected to the third terminal.

16. The piezoelectric element according to claim 1, wherein each of the plurality of central electrodes includes an extraction electrode connected to one of the first, second, fourth, or fifth terminal.

17. The piezoelectric element according to claim 1, wherein each of the plurality of peripheral electrodes includes an extraction electrode connected to one of the first, second, fourth, or fifth terminal.

18. The piezoelectric device according to claim 7, wherein the metal terminal members are connected to respective ones of the first and second terminals of the alternating-current power supply and the first to fifth terminals of the piezoelectric element by a conductive paste or solder.

19. The piezoelectric device according to claim 7, wherein each of the metal terminal members is in partial contact with at least one of the first and second terminals of the alternating-current power supply and the first to fifth terminals of the piezoelectric element by a conductive paste or solder.

20. The piezoelectric device according to claim 7, wherein none of the metal terminal members are in direct contact with any of the first and second terminals of the alternating-current power supply and the first to fifth terminals of the piezoelectric element by a conductive paste or solder.

* * * * *